United States Patent [19]

Sano et al.

[11] 4,288,529
[45] Sep. 8, 1981

[54] USE OF PHOTO-CURABLE COMPOSITE MATERIALS TO MAKE A STENCIL

[75] Inventors: Takezo Sano, Takatsuki; Haruo Inoue, Kobe; Akihiro Furuta, Takatsuki, all of Japan

[73] Assignee: Sumitomo Chemical Company Limited, Higashi, Japan

[21] Appl. No.: 115,492

[22] Filed: Jan. 25, 1980

Related U.S. Application Data

[63] Continuation of Ser. No. 888,864, Mar. 22, 1978, Pat. No. 4,216,287.

[30] Foreign Application Priority Data

Mar. 26, 1977 [JP] Japan ................................. 52/33782

[51] Int. Cl.³ .............................................. G03C 5/00
[52] U.S. Cl. ...................................... 430/308; 430/271
[58] Field of Search ............................... 430/308, 271

[56] References Cited

U.S. PATENT DOCUMENTS

| | | | |
|---|---|---|---|
| 3,532,052 | 10/1970 | Erickson et al. | 430/281 |
| 3,753,715 | 8/1973 | Klopfel et al. | 430/281 |
| 3,801,410 | 4/1974 | Detrick et al. | 430/5 |
| 3,895,949 | 7/1975 | Akamatsu et al. | 430/275 |
| 3,961,961 | 6/1971 | Rich | 430/263 |
| 4,076,535 | 2/1978 | Putten | 430/271 |
| 4,093,464 | 6/1978 | Ruckert et al. | 430/193 |

*Primary Examiner*—Jack P. Brammer
*Attorney, Agent, or Firm*—Birch, Stewart, Kolasch and Birch

[57] ABSTRACT

A photo-curable composite material used for preparing various stencils for screen printing, textile printing or the like, which comprises a flat, flexible and photo-transmitting thin film (A); a flat and flexible film (B); a liquid photo-curable resin and a flat screen material, said films (A) and (B) being air-tightly bonded to each other at the peripheral portion thereof to form a flat inner space therein, said liquid resin being filled in said inner space to form a layer and said screen material also being placed in the inner space substantially in parallel with the inner walls of the films (A) and (B).

2 Claims, 4 Drawing Figures

4,288,529

USE OF PHOTO-CURABLE COMPOSITE MATERIALS TO MAKE A STENCIL

This application is a continuation of copending application Ser. No. 888,864, filed on Mar. 22, 1978, now U.S. Pat. No. 4,216,287.

The present invention relates to photo-curable composite materials having improved application properties and used for preparing various stencils for screen printing, textile printing or the like. More particularly, the composite material of the present invention comprises a flat photo-transmitting package containing a liquid photo-curable resin and a flat screen material on which the resin is cured to form a pattern or image by irradiation of actinic light through the package. The cured resin supported on the screen material serves as a stencil.

A process for forming patterns or images on photosensitive resin materials such as a photo-curable resin material by irradiation of actinic light has been studied and has already been utilized in a practical preparation of an etching resist, a relief or other printing materials such as a stencil or the like.

As photosensitive resin materials used for preparing stencils, generally, there have been used those so-called solvent-dry type sensitizing solutions prepared by dissolving a solid photo-crosslinkable resin in a solvent. However, when coating a solution of this type on a screen material, the solvent evaporates therefrom and it causes problems of polluting the working environment. In addition, when a thick coating layer of the resin is desired, the coating should be repeated or built up in layers, and a fairly long period of time is required for drying the coated product and exposing it to actinic light to form a pattern or image thereon. Therefore, improvements in such materials are strongly needed.

On the other hand, photopolymerizable-crosslinkable resins have been commonly used as photosensitive resins for forming a relief. These resins are available in solid forms as well as in liquid forms. Some attempts have been made to prepare stencils by laminating a sheet made of this solid type resin on gauze. However, the printing material is expensive and it takes a long time for plate-making even though the above solid photosensitive resin sheet can be easily handled and processed by an inexpensive plate-making machine. Moreover, other problems such as poor adhesion in laminating occur.

In case of using a liquid resin in the preparation of a stencil, it is necessary to shape the resin into a layer having a pre-determined thickness and area before photo-setting thereof by irradiation of actinic light to form images even though the printing material is inexpensive and a long time is not required for plate-making. Particularly, when a liquid resin is shaped into a composite material together with gauze, it is necessary to handle the resin carefully since small air bubbles are liable to be included therein. This requires much time and special technique. Further, excess resin is scattered about and the working environment is polluted. In addition, partially insufficient photo-setting occurs since a liquid resin is liable to wave or move during the irradiation step, which disturbs the image to be formed thereon and results in partial lack of images, poor image reproducibility and poor resolution.

Under these circumstances, we have intensively studied utilizing liquid photo-curable resins in the preparation of stencils without experiencing the above defects thereof and thereby have attained the present invention.

It is an object of the present invention to provide a novel photo-curable composite material used for preparing various stencils, the main component of which is a liquid photo-curable resin. Another object of the present invention is to provide a photo-curable composite material used for preparing various stencils which has an improved structure and improved application properties. Still a further object of the present invention is to provide a photo-curable composite material used for preparing various stencils which requires no special plate-making machine and has superior image reproducibility.

BRIEF DESCRIPTION OF THE DRAWINGS

Other objects of the present invention will become apparent from the following description with reference to the accompanying drawings in which.

DETAILED DESCRIPTION OF THE INVENTION

The foregoing objects and other objects of the present invention are generally accomplished in accordance with the present invention by providing a photo-curable composite material used for preparing various stencils for screen printing, textile printing or the like, which comprises a flat, flexible and photo-transmitting thin film (A); a flat and flexible film (B); a liquid photo-curable resin and a flat screen material, said films (A) and (B) being air-tightly bonded to each other at the peripheral portion thereof to form a flat inner space therein, said liquid resin being filled in said inner space to form a layer and said screen material being also placed in the inner space substantially in parallel with the inner walls of the films (A) and (B).

In the composite material of the present invention, despite the use of a liquid resin, there is no need to shape a liquid resin into a specific layer before irradiation since it is filled and air-tightly enclosed in a package or bag formed with films (A) and (B) in a form of a layer having a pre-determined thickness and area. Moreover, problems such as partial lack of images, poor image reproducibility or the like are eliminated since waving or movement of a liquid resin during the image forming procedure is prevented by filling the resin in a package formed with films (A) and (B).

Figure 1:
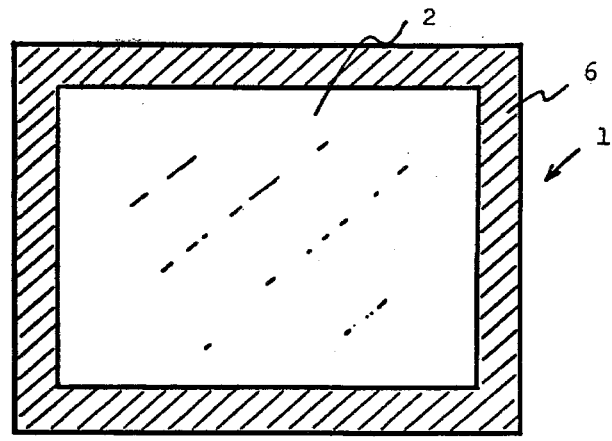
FIG. 1 is a schematic plan view of a preferred embodiment of the photo-curable composite material provided by the present invention.
Figure 2:
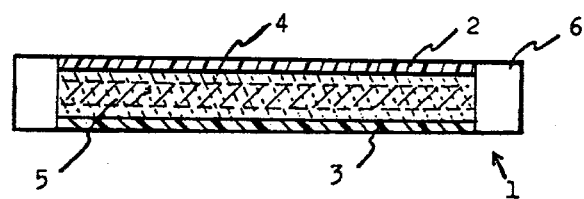
FIG. 2 is a schematic cross-section of the composite material shown in FIG. 1.

Referring now to the drawings, FIGS. 1 and 2 show respectively a schematic plan view and section of a preferred embodiment of the photo-curable composite material of the present invention. The composite material 1 comprises a flat, flexible and photo-transmitting thin film (A) 2, a flat and flexible film (B) 3, a liquid photo-curable resin 4 and a flat screen material 5. The films (A) and (B) are air-tightly bonded to each other at the peripheral portion 6 to form a flat inner space, that is, a package which is filled with the liquid resin 4 in a form of a layer. In the inner space, there is also placed the screen material 5 substantially in parallel with inner walls of the films (A) and (B). Generally, the composite material 1 is prepared by air-tightly bonding the films (A) and (B), at their suitable peripheral portions to form a flat bag and putting therein the liquid resin 4 and the screen material 5 and then sealing the bag.

The film (A) used in the present invention should have photo-transmitting properties, flatness and flexibility. It is sufficient that film (A) has enough photo-transmitting properties to permit substantial transmission of actinic light through the film. Preferably, the transmittance of film (A) is 50% or more, more preferably 90% or more.

For the degree of flatness of film (A), it is sufficient that the film is prevented from wrinkling at the image forming portion thereof when the composite material of the present invention is placed on a flat surface or inserted between flat surfaces so as to irradiate actinic light.

The flexibility of film (A) is required to prevent the composite material of the present invention from breakage by some bending on handling thereof.

Generally, the thickness of film (A) may be 5 to 100 microns. However, it is preferable to use a film having 50 microns or less in thickness to minimize fogginess of images since, in practice of image formation, a photomask is often placed on the outer surface of film (A) which may cause fogginess of images. Further, it is preferable that film (A) has a good peelability since it should be peeled off after photo-setting of a liquid resin to obtain a stencil. Examples of film (A) are cellophane; thermoplastic resins such as polyethylene, polypropylene, polyesters, polystyrene, polyvinyl chloride and nylon; a laminated film thereof or the like.

The film (B) should have flatness and flexibility. If desired, it may also have photo-transmitting properties the same as film (A). The thickness of film (B) is not critical, but the thickness is preferably 5 microns to 5 mm, more preferably 10 microns to 1 mm. Of course, a film having the same properties or characteristics as the above film (A) may be used as film (B). In this case, films (A) and (B) may be merely a sheet of a flat, flexible and photo-transmitting thin film as described above which is doubled to form a bag.

In some cases, it is preferable to previously treat the surface of the film by coating or finishing to provide improved adhesion and reflecting properties.

The liquid photo-curable resin used as a main component of the composite material of the present invention is a liquid composition having a viscosity ranging from 1 to $10^6$ cp at room temperature and solidifying by photo-crosslinking, photopolymerizing or both when it is irradiated with the so-called actinic light having a wave length ranging from 2,000 to 8,000 Å. Examples of the liquid compositions are those containing a photopolymerization initiator and a compound which has an addition-polymerizable ethylenically unsaturated bond in the molecule thereof. For example, those liquid photo-curable resins disclosed in U.S. Pat. No. 2,760,863, French Pat. Nos. 1,591,116 and 1,471,432 and Japanese Patent Publication (unexamined) No. 155303/1975 may be used. Also, commercially available liquid resin products for letterpress printing can be used as the liquid photo-curable resin of the present invention. Examples of these are APR (Trade mark of a letterpress printing resin produced and sold by Asahi Chemical Industry Co.), Letter Flex (Trade mark of letterpress printing resin produced and sold by W. R. Grace Co.), Tevista (Trade mark of letterpress printing resin produced and sold by Teijin Co.) or the like.

It has been known that there is a close relationship between the viscosity of a liquid resin and a process for plate-making. Therefore, hitherto, a particular process and equipment should be determined by taking into consideration the particular viscosity of the liquid resin used in plate-making. In the present invention, however, there is no limitation of viscosity of the liquid photo-curable resin used since the resin is filled and air-tightly packed in a flat package as described above. Thus, in the present invention, there can be used various liquid resins having any viscosity such as a free-flowing liquid resin as well as a highly viscous liquid resin.

The composition of the liquid resin used in the present invention will be properly determined by those skilled in the art according to the particular use of the stencil to be produced. Other solid ingredients such as pigments, fillers, reinforcing agents or the like may also be added to the liquid resin in such an extent that they do not affect the photo-curability of the resin.

The flat screen material, which is another main component of the present invention, is a sheet material through which liquid can permeate freely and includes, for example, the so-called screen mesh for screen printing or textile printing, cloth or non-woven fabric, net, the so-called metal filter prepared by etching or plating metals or the like. They may be made of silk, polyesters, polypropylene, high-density polyethylene, nylon, glass, various metals or the like.

Although the thickness of the screen material depends upon the particular use of the stencil obtained from the composite material of the present invention, it is preferable to be equal to or less than the thickness of the photo-curable resin layer in the inner space formed with films (A) and (B). Preferably, the thickness of the screen material is that within a range from 20 microns to 1 mm. The mean size of opening or mesh of the screen material is 1 micron to 10 mm, preferably 10 microns to 5 mm.

Figure 3:
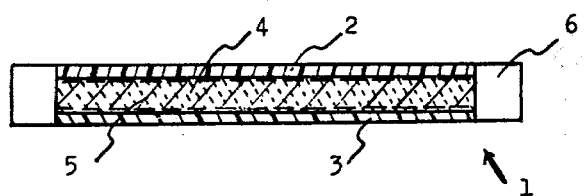
FIG. 3 is a schematic cross-section of another preferred embodiment of the photo-curable composite material provided by the present invention.

In one embodiment of the present invention, the liquid resin in the inner space is partially impregnated in the screen material, the remaining liquid resin is located between the screen material and film (A) or (B) as shown in FIG. 2. In another embodiment, the liquid resin in the inner space may almost be impregnated in the screen material and thereby the screen material may be substantially contiguous to or in contact with the films (A) and (B) as shown in FIG. 3.

As described above, the liquid photo-curable resin and the screen material is filled and air-tightly enclosed in the flat bag formed with films (A) and (B).

For enclosing the resin and the screen material, films (A) and (B) are bonded to each other. It is convenient to employ a known melt-bonding process, heat-bonding process or photo-bonding process for this purpose. However, a suitable adhesive may also be used if these processes are difficult to employ. It is desirable to use films selected from the group consisting of thermoplastic resin thin films and laminates thereof as films (A) and (B) since they can be readily melted and bonded to each other by heating to give an air-tight seal and there is no trouble such as leakage of the enclosed liquid resin on handling. Preferably, the sealing is carried out while preventing inclusion of any air bubbles into the bag.

For example, the photo-curable composite material of the present invention is prepared by the following several processes:

(1) The composite material is prepared by placing a flat screen material on film (B), coating a liquid photo-curable resin thereon, further placing film (A) thereon and then sealing the composite at the peripheral portion thereof;

(2) The composite material is prepared by forming a flat bag with films (A) and (B), putting a flat screen material and a liquid resin into the bag, and then sealing the bag; or (3) The composite material is prepared by a continuous process in which a flat screen material and a liquid resin is put into a bag while the bag is continuously formed with rolled sheet product(s) of film (A) or films (A) and (B) and then the bag is sealed.

Any of these processes can be automatically carried out by a technique known to the prior art so as to produce the composite materials of the present invention at a low cost in mass production.

The required volume of the liquid photo-curable resin to be enclosed in the composite material of the present invention is dependent upon the desired thickness and area of the stencil to be produced and determined by the particular volume of the inner space formed with films (A) and (B). The mean thickness (calculated value) of the photo-curable resin layer in the inner space is determined taking into consideration the photo-setting properties of the resin used such as the photo-setting rate, strength of the cured resin or the like. The thickness of the resin layer may be 10 microns to 10 mm, preferably 0.05 to 5 mm. When colored products are desired, the mean thickness is preferably 0.05 to 1 mm since the photo-setting thereof is not facile in comparison with an uncolored product.

Usually, the flat screen material is wholly enclosed in the inner space formed with films (A) and (B) and placed in parallel with inner walls of the central flat part of films (A) and (B). However, the peripheral ends of the screen material may protrude out of the inner space between films (A) and (B) without breaking the air-tightness of the inner space. In this case, it is very convenient to handle the composite material since the screen material is fixed between films (A) and (B).

To prepare a stencil from the photo-curable composite material of the present invention, the material is treated, for example, as described hereinafter.

(1) Firstly, the composite material of the present invention is placed on a flat plate (e.g. glass plate) with the film (A) side turned upward.

(2) Then, one or more spacers having the desired thickness are placed around the peripheral portion of the composite material.

(3) A photo-mask is placed on the composite material while preventing the film (A) from wrinkling.

(4) Further, a photo-transmitting plate having good flatness (e.g. glass plate, quartz plate or the like) is placed on the above assembly to cover all the top surface thereof and pressed downwardly until the photo-transmitting plate is contacted with the spacer(s) and thereby the photo-mask is brought into an intimate contact with the surface of film (A). When the thickness of the spacer used is not a suitable one, the following operation may be carried out:

Where the thickness of the spacer is too large and the volume of the liquid resin is too small to intimately contact the phototransmitting plate with the surface of the assembly, one or more supplemental soft sheet materials are inserted at suitable portions where image formation is not affected.

Contrary, where the thickness of the spacer is too small and the volume of the resin is too large to contact the photo-transmitting plate with the spacer, the photo-transmitting plate is moved so as to put the enclosed excess resin aside at the portion where image formation is not affected.

(5) After completion of intimate contact of the photo-transmitting plate with the assembly, the resin is cured by irradiation with actinic light through the photo-transmitting plate, the photo-mask and film (A) to form images or patterns thereon.

(6) The composite material is taken out, and film (A) or film (B) or both films (A) and (B) are peeled off therefrom, followed by development of the image by removing the uncured resin. The removal of the uncured resin can be carried out according to the nature of the resin used by a method known to the prior art such as wiping-off, suction, blowing-off, rubbing-off, washing-out with detergent or an organic solvent or the like.

(7) And then, drying and post-irradiation are carried out, if necessary, to obtain the desired stencil.

It has now found that the composite material of the present invention becomes more convenient for use by integrating a spacer which has a pre-determined thickness in the inner space adjacent to the bonded portion of films (A) and (B). The thickness of the spacer is properly determined in consideration of the volume of the resin filled in the inner space. When using the composite material of this type, the image forming step becomes more simple and the above procedure (2) can be omitted. Further, the above procedure (4) can be carried out more surely, simply and rapidly.

Figure 4:
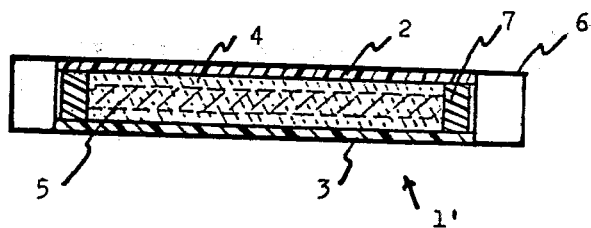
FIG. 4 is a schematic cross-section of still another preferred embodiment of the photo-curable composite material provided by the present invention.

Turning to the accompanying FIG. 4, there is shown a schematic section of another preferred embodiment of the composite material having an integrated spacer in the inner space.

Like the composite material 1 shown in FIG. 1 and 2, the composite material 1' as shown in FIG. 4 also comprises a film (A) 2, film (B) 3, a liquid photo-curable resin 4 and a screen material 5. Further, the composite material 1' has a spacer 7 in the inner space adjacent to the bonded portion 6.

The material and shape of the spacer are not critical. The length, width, shape and number of the spacers may be determined so as not to deform the spacer under the pressure for contacting the photo-transmitting plate with the assembly in the image forming step. It is preferable to use a tape made of a solid flexible resin which is capable of melt-bonding or bonding as the spacer since it can be integrated more easily. In practice, two flat tape spacers are arranged at both side ends of the inner space, or a frame of tape spacers is arranged around the inner space adjacent to the bonded portion. This is convenient for use in practice.

Further, when a screen material has enough thickness to impregnate all the liquid resin layer in the inner space in its own structure (see FIG. 3), the screen material per se acts as a spacer and therefore the resin is readily cured in a definite thickness.

Thus, the composite material of the present invention has following advantages.

(1) The material causes no leakage of a liquid resin and pollution of the working environment and is convenient for use since the liquid resin is air-tightly enclosed in a photo-transmitting package.

(2) There is no influence of oxygen and therefore even resins such as those which are easily hindered from curing by oxygen can be used without any problem since the liquid resin is air-tightly enclosed in a package.

(3) The viscosity of liquid photo-curable resins can be varied widely and the change of viscosity according to the change of temperature does not affect the image formation.

(4) Adjustment of the thickness of the composite material before image formation can be carried out very simply without requiring any expensive equipment.

(5) Image reproducibility and image resolution of the product prepared from the composition material are superior to those of any conventional image forming process since waving or movement of the liquid resin is inhibited in the image forming step and no disturbance and lack of images are observed.

(6) The thickness of the liquid resin layer can be easily adjusted on the spot.

(7) The composite material is inexpensive since the liquid photo-curable resin is used as a main component and it does not take a long time in image forming.

(8) When only a necessary part of the composite material is irradiated, the remaining non-irradiated part can be re-used by cutting off the irradiated part so as to block the liquid resin in the remaining non-irradiated part by leaving the cured resin at the cut end thereof.

Further, since the flat screen material is also enclosed in the inner space of the composite material, there exists some other advantages as follows.

(9) The patterns formed with the cured resin do not break up into pieces and are linked to each other, even when both films (A) and (B) are peeled off after image formation.

(10) In case of coating a liquid photo-curable resin on a screen, small air bubbles are liable to be included therein unless the operation is carried out carefully. When using the composite material of the present invention, there is no need for such an operation and it is possible to start the irradiation step immediately.

Thus, according to the present invention, various stencils having high-quality photo-cured images can be obtained at a low cost. That is, the composite materials of the present invention can be used for the preparation of various stencils for providing various patterns including screen printing and textile printing. They are also used for the preparation of hollow letters, hollow patterns or the like.

The following examples illustrate the present invention but are not to be construed as limiting the scope thereof.

EXAMPLES 1 to 6

The composite materials listed in the following Table 1 were prepared and their properties were evaluated as follows:

Six bags, each having an effective inner space area of 210 mm×250 mm were made of the photo-transmitting thin films (A) and the films (B) listed in Table 1, respectively. The screen listed in Table 1 having an appropriate size and the required amount of a liquid photo-curable unsaturated polyester type resin (viscosity: 1100 cp at 25° C.) were put into each of the above prepared bags and spread out in a uniform thickness. Each bag was then sealed by heating while preventing infiltration of air to obtain the desired composite material.

Each composite material thus obtained was placed on a flat working stand with the film (A) side turned upward and a steel belt spacer arranged adjacent to both of the side ends of the material. A photo-mask was placed on the surface of the material and then a float glass plate of 200 mm×240 mm×10 mm (thickness) was placed thereon. After smoothing wrinkles on the surface of the composite material, the assembly was irradiated through the glass plate with ultraviolet fluorescent lamps (20 W×5), 10 cm apart from the glass plate, for 2 minutes. When the irradiation was completed, the composite material was taken out, cut open at one end thereof and one of the thin films was peeled off. This was then developed with an aqueous weak alkaline solution and dried to give the desired stencil product which was evaluated as to its image reproducibility (Image), image resolution and thickness accuracy. The results are shown in Table 1.

TABLE 1

| | Photo-curable composite material | | | | | Evolution of photo-cured product | | |
|---|---|---|---|---|---|---|---|---|
| Example No. | Photo-transmitting thin film (A) | Film (B) | Amount of resin | Screen | Thickness of spacer | Image | Resolution | Thickness accuracy |
| 1 | Polyethylene (38 μ)* | Polyethylene (38 μ)* | 5 g | Polyester gauze 300 mesh(100 μ)* | 0.1 mm | Good | 150 μ | ±0.01 mm |
| 2 | Polypropylene (20 μ) | Polypropylene (45 μ) | 5 g | Silk gauze 200 mesh (70 μ) | 0.1 mm | Good | 200 μ | ±0.01 mm |
| 3 | Polyethylene/ nylon laminate (35 μ) | Polyethylene/ nylon laminate (35 μ) | 10 g | Glass mat (80 μ) | 02. mm | Good | 200 μ | ±0.02 mm |
| 4 | Polyethylene (38 μ) | Polyethylene (38 μ) | 12 g | Polyester gauze 60 mesh (100 μ) | 0.2 mm | Good | 200 μ | ±0.01 mm |
| 5 | Polyethylene/ nylon laminate (35 μ) | Polyethylene/ nylon laminate (80 μ) | 10 g | SUS mesh** 200 mesh (100 μ) | 0.2 mm | Good | 200 μ | ±0.01 mm |
| 6 | Polyethylene (38 μ) | Polyethylene/ nylon laminate (80 μ) | 25 g | Nylon gauze 60 mesh (200 μ) | 0.5 mm | Good | 250 μ | ±0.05 mm |

[Note]:
*Thickness
**Stainless steel

EXAMPLE 7

According to the similar procedure as described in Example 1, a composite material was prepared by adhering two spacers made of hard paper of 200 mm×20 mm×0.2 mm (thickness) at opposite side ends of the inner space of a bag formed with the same films as in Example 3. Into this bag, a polyester gauze (200 mesh, thickness 100 microns) and 8 g of the liquid photo-curable unsaturated polyester resin were filled and then heat-sealed while preventing infiltration of air to give a desired composite material. Similar to Examples 1 to 6, the image formation was carried out on the composite material but without using any special spacer. Thus, a high-quality stencil having thickness accuracy of ±0.01 mm was obtained.

EXAMPLE 8

A polyester film having 12 microns of thickness was placed on a flat glass plate and then a 100-mesh polyester gauze having 110 microns of thickness was placed thereon. A liquid unsaturated polyester type resin was coated on the gauze and then polyester film having 12 microns of thickness was placed on the coated surface. A float glass plate was placed on the laminate and pressure was applied thereto.

After covering the central portion of the glass plate with masking film, the peripheral portion thereof was exposed to actinic light to cure the resin and two sheets of the films and the gauze were bonded together. Image formation was carried out in the same manner as in Example 7, and a high-quality stencil having thickness accuracy of ±0.01 mm was obtained.

What is claimed is:

1. A process for preparing a stencil which comprises:

placing a photomask on a photo-curable composite material which comprises a flat, flexible and photo-transmitting thin film (A); a flat and flexible film (B); a liquid photo-curable resin and a flat screen material, said films (A) and (B) being air-tightly bonded to each other at their peripheral portion thereof to form a flat inner space therebetween, said liquid photo-curable resin being disposed in said inner space to form a layer, and said screen material also being disposed in the inner space substantially in parallel with the inner walls of the films (A) and (B);

curing the liquid photo-curable resin in the photo-curable composite material by irradiation with actinic light through said photomask; and removing the uncured resin to develop an image after peeling off at least one film from the irradiated composite material.

2. A process according to claim 1, wherein said screen material is a glass mat.

* * * * *

UNITED STATES PATENT AND TRADEMARK OFFICE
CERTIFICATE OF CORRECTION

PATENT NO. :  4,288,529
DATED     :  September 8, 1981
INVENTOR(S) :  Sano et al It is certified that error appears in the above—identified patent and that said Letters Patent is hereby corrected as shown below:

In category [63] change "Continuation" to

--Division--

Signed and Sealed this

Second Day of March 1982

[SEAL]

Attest:

GERALD J. MOSSINGHOFF

Attesting Officer  Commissioner of Patents and Trademarks